(12) United States Patent
Chen et al.

(10) Patent No.: US 12,232,355 B2
(45) Date of Patent: Feb. 18, 2025

(54) DISPLAY PANEL, METHOD FOR MANUFACTURING SAME, AND DISPLAY APPARATUS

(71) Applicants: MIANYANG BOE OPTOELECTRONICS TECHNOLOGY CO., Ltd., Sichuan (CN); BOE Technology Group Co., Ltd., Beijing (CN)

(72) Inventors: Tao Chen, Beijing (CN); Hsinju Ho, Beijing (CN); Honglei Hai, Beijing (CN); Fenggang Zhang, Beijing (CN)

(73) Assignees: MIANYANG BOE OPTOELECTRONICS TECHNOLOGY CO., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 438 days.

(21) Appl. No.: 17/676,404

(22) Filed: Feb. 21, 2022

(65) Prior Publication Data
US 2022/0320466 A1    Oct. 6, 2022

(30) Foreign Application Priority Data
Mar. 30, 2021    (CN) .......................... 202110343108.0

(51) Int. Cl.
*H01L 51/52* (2006.01)
*H01L 51/56* (2006.01)
*H10K 50/844* (2023.01)
*H10K 71/00* (2023.01)
*H10K 71/80* (2023.01)

(52) U.S. Cl.
CPC ........... *H10K 50/844* (2023.02); *H10K 71/00* (2023.02); *H10K 71/80* (2023.02); *H10K 71/851* (2023.02)

(58) Field of Classification Search
CPC .. H01L 27/1218; H10K 59/12; H10K 50/844; H10K 71/00; H10K 71/80; H10K 71/851; H10K 59/8731
See application file for complete search history.

(56) References Cited

U.S. PATENT DOCUMENTS

| | | | | |
|---|---|---|---|---|
| 9,905,801 | B2* | 2/2018 | Kim | H01L 27/124 |
| 10,109,692 | B2* | 10/2018 | Senda | H10K 59/80522 |
| 10,135,020 | B1* | 11/2018 | Zhang | H01L 27/0248 |
| 10,340,476 | B2* | 7/2019 | Park | H10K 59/80522 |
| 10,818,874 | B2* | 10/2020 | Park | H10K 50/15 |
| 10,957,757 | B2* | 3/2021 | Youn | H10K 59/8722 |

(Continued)

FOREIGN PATENT DOCUMENTS

| | | |
|---|---|---|
| CN | 111446381 A | 7/2020 |
| CN | 111816665 A | 10/2020 |

OTHER PUBLICATIONS

CN202110343108.0 first office action.

*Primary Examiner* — Jarrett J Stark
(74) *Attorney, Agent, or Firm* — IPro, PLLC

(57) ABSTRACT

A display panel is provided. The display panel includes: a substrate, and a light-emitting device, an encapsulation layer and an auxiliary barrier which are disposed on the substrate. The light-emitting device is disposed in a display area, and the auxiliary barrier is disposed in a non-display area. A height of the auxiliary barrier is greater than a distance between a side of the encapsulation layer away from the substrate and the substrate.

11 Claims, 3 Drawing Sheets

(56) References Cited

U.S. PATENT DOCUMENTS

| | | | | |
|---|---|---|---|---|
| 11,251,404 B2* | 2/2022 | Park | ............... | H10K 50/15 |
| 11,462,607 B2* | 10/2022 | Zhang | ............... | H10K 71/00 |
| 11,653,551 B2* | 5/2023 | Yun | ............... | H10K 77/111 |
| | | | | 257/40 |
| 11,706,945 B2* | 7/2023 | Bang | ............... | H10K 50/82 |
| | | | | 257/88 |
| 11,785,798 B2* | 10/2023 | Kwon | ............... | H10K 50/171 |
| 11,793,029 B2* | 10/2023 | Park | ............... | H10K 50/8445 |
| 11,805,668 B2* | 10/2023 | Lv | ............... | H10K 59/88 |
| 11,882,735 B2* | 1/2024 | Bang | ............... | H10K 71/00 |
| 2007/0222375 A1* | 9/2007 | Liu | ............... | H10K 59/38 |
| | | | | 313/506 |
| 2012/0206684 A1* | 8/2012 | Lee | ............... | G02F 1/1337 |
| | | | | 445/24 |
| 2014/0183502 A1* | 7/2014 | Song | ............... | H10K 50/824 |
| | | | | 257/40 |
| 2015/0034935 A1* | 2/2015 | Choi | ............... | H10K 50/844 |
| | | | | 257/40 |
| 2015/0060806 A1* | 3/2015 | Park | ............... | H10K 59/873 |
| | | | | 257/40 |
| 2015/0062524 A1* | 3/2015 | Kim | ............... | G02F 1/1339 |
| | | | | 156/275.3 |
| 2015/0380685 A1* | 12/2015 | Lee | ............... | H10K 59/8731 |
| | | | | 257/40 |
| 2016/0035997 A1* | 2/2016 | Oh | ............... | H10K 59/8722 |
| | | | | 257/40 |
| 2016/0043348 A1* | 2/2016 | Zhang | ............... | H10K 59/12 |
| | | | | 257/40 |
| 2016/0064686 A1* | 3/2016 | Odaka | ............... | H10K 50/8426 |
| | | | | 257/89 |
| 2016/0077383 A1* | 3/2016 | Lee | ............... | G02F 1/133723 |
| | | | | 438/23 |
| 2016/0111677 A1* | 4/2016 | Hong | ............... | H10K 50/8426 |
| | | | | 257/40 |
| 2016/0147094 A1* | 5/2016 | Choi | ............... | G02F 1/1337 |
| | | | | 216/13 |
| 2016/0190503 A1* | 6/2016 | Chang | ............... | H10K 77/10 |
| | | | | 257/40 |
| 2016/0204373 A1* | 7/2016 | Park | ............... | H10K 59/124 |
| | | | | 257/40 |
| 2016/0254479 A1* | 9/2016 | Jeong | ............... | H10K 50/84 |
| | | | | 257/40 |
| 2016/0260928 A1* | 9/2016 | Choi | ............... | H10K 59/873 |
| 2016/0270209 A1* | 9/2016 | Cho | ............... | H10K 50/805 |
| 2016/0307971 A1* | 10/2016 | Jeon | ............... | H01L 22/30 |
| 2016/0336541 A1* | 11/2016 | Kim | ............... | H10K 50/8445 |
| 2017/0077456 A1* | 3/2017 | Chung | ............... | H10K 50/8445 |
| 2017/0148856 A1* | 5/2017 | Choi | ............... | H10K 59/873 |
| 2017/0162637 A1* | 6/2017 | Choi | ............... | G09G 3/3225 |
| 2017/0237037 A1* | 8/2017 | Choi | ............... | H10K 50/844 |
| | | | | 257/40 |
| 2017/0237038 A1* | 8/2017 | Kim | ............... | H10K 77/10 |
| | | | | 257/40 |
| 2017/0294502 A1* | 10/2017 | Ka | ............... | H10K 59/123 |
| 2019/0131562 A1* | 5/2019 | Rhe | ............... | H10K 50/844 |
| 2019/0214595 A1* | 7/2019 | Park | ............... | G06F 3/0443 |
| 2020/0027940 A1 | 1/2020 | Wang et al. | | |
| 2020/0052050 A1* | 2/2020 | Jiang | ............... | H10K 50/844 |
| 2021/0296271 A1* | 9/2021 | Jeong | ............... | H01L 24/03 |
| 2021/0335914 A1* | 10/2021 | Du | ............... | H10K 59/8052 |
| 2023/0108064 A1* | 4/2023 | Kang | ............... | H10K 71/00 |
| | | | | 257/72 |
| 2024/0130175 A1* | 4/2024 | Shang | ............... | H10K 59/873 |
| 2024/0224718 A1* | 7/2024 | Wang | ............... | H10K 59/122 |

* cited by examiner

DISPLAY PANEL, METHOD FOR MANUFACTURING SAME, AND DISPLAY APPARATUS

CROSS-REFERENCE TO RELATED APPLICATION

This application claims priority to Chinese Patent Application No. 202110343108.0, filed on Mar. 30, 2021 and entitled "DISPLAY PANEL, METHOD FOR MANUFACTURING SAME, AND DISPLAY APPARATUS", the entire content of which is incorporated herein by reference.

TECHNICAL FIELD

The present disclosure relates to the field of display technologies, and in particular to a display panel, a method for manufacturing the same, and a display apparatus.

BACKGROUND

Due to the characteristics such as low power consumption, self-luminescence, high color saturation, fast response, wide viewing angle and the capability of achieving flexibility, an organic light-emitting diode (OLED), as a current-type light-emitting device, is increasingly applied in the field of high-performance display.

SUMMARY

Embodiments of the present disclosure provide a display panel, a method for manufacturing the same, and a display apparatus. The technical solutions are as follows.

In a first aspect of the embodiments of the present disclosure, a display panel is provided. The display panel includes: a substrate, including a display area and a non-display area surrounding the display area; a light-emitting device and an encapsulation layer which are disposed on the substrate, the light-emitting device being disposed in the display area; and an auxiliary barrier disposed on the substrate, the auxiliary barrier being disposed in the non-display area; wherein a height of the auxiliary barrier is greater than a distance between a side of the encapsulation layer away from the substrate and the substrate.

In some embodiments, the auxiliary barrier is annular, and the auxiliary barrier is disposed around the display area.

In some embodiments, a plurality of auxiliary barriers are provided, and the plurality of auxiliary barriers are sequentially socketed.

In some embodiments, a shape of the display area is a polygon, the auxiliary barrier is a bent barrier formed by two strip-shaped barriers connected with each other, and the auxiliary barrier is disposed around a top corner of the display area.

In some embodiments, the shape of the display area is a rectangle, and four auxiliary barriers are provided, wherein the four auxiliary barriers are disposed around four top corners of the display area respectively.

In some embodiments, the height of the auxiliary barrier ranges from 8 to 15 μm, and a width of the auxiliary barrier in a direction parallel to the substrate ranges from 30 to 50 μm.

In some embodiments, the encapsulation layer includes: a first inorganic encapsulation layer, an organic encapsulation layer and a second inorganic encapsulation layer which are laminated.

In some embodiments, the display panel further includes: a barrier body disposed in the non-display area, wherein the barrier body is closer to the display area than the auxiliary barrier is, the first inorganic encapsulation layer and the second inorganic encapsulation layer cover the barrier body, and an orthographic projection of the organic encapsulation layer on the substrate and an orthographic projection of the barrier body on the substrate are not overlapped.

In some embodiments, the barrier body is annular, and the barrier body is disposed around the display area.

In some embodiments, two barrier bodies are provided, and the two barrier bodies are a first barrier body and a second barrier body respectively, wherein the first barrier body is closer to the display area than the second barrier body is, and a height of the second barrier body is greater than a height of the first barrier body.

In some embodiments, the height of the first barrier body and the height of the second barrier body are both less than the height of the auxiliary barrier.

In some embodiments, the non-display area includes: a diffusion area disposed between the second barrier body and the auxiliary barrier, and the encapsulation layer includes an inorganic layer disposed in the diffusion area, wherein a thickness of the inorganic layer gradually decreases along a direction from the second barrier body to the auxiliary barrier.

In some embodiments, a minimum distance between the auxiliary barrier and the second barrier body ranges from 200 to 500 μm.

In some embodiments, a material of the auxiliary barrier and a material of the barrier body both include: polyimide.

In some embodiments, the display panel further includes: a pixel defining layer disposed on the substrate, wherein the pixel defining layer is configured to define a pixel area in the display panel, the light-emitting device is disposed in the pixel area, and the encapsulation layer is disposed on a side of the pixel defining layer away from the substrate.

In a second aspect of the embodiments of the present disclosure, a method for manufacturing a display panel is provided. The method includes: forming a light-emitting device, an encapsulation layer and an auxiliary barrier on a substrate; wherein the substrate includes a display area and a non-display area surrounding the display area; the light-emitting device is disposed in the display area; the auxiliary barrier is disposed in the non-display area; and a height of the auxiliary barrier is greater than a distance between a side of the encapsulation layer away from the substrate and the substrate.

In some embodiments, forming the light-emitting device, the encapsulation layer and the auxiliary barrier on the substrate includes: providing a display motherboard, wherein the display motherboard includes a plurality of panel areas and an annular cutting buffer area surrounding each of the panel areas, and the display motherboard includes: the light-emitting device and the encapsulation layer which are disposed in the panel area, and the auxiliary barrier disposed in the cutting buffer area; and performing first cutting processing on the display motherboard along an outer boundary of the cutting buffer area, to acquire the display panel with the auxiliary barrier.

In some embodiments, the display motherboard further includes: a protective film bonded to the encapsulation layer and the auxiliary barrier; and after performing the first cutting processing on the motherboard along the outer boundary of the cutting buffer area, the method further includes: peeling off the protective film on the display panel; and performing second cutting processing on the display panel along an inner boundary of the cutting buffer area, to cut off the auxiliary barrier in the display panel.

In a third aspect of the embodiments of the present disclosure, a display apparatus is provided. The display apparatus includes: a power supply assembly and a display panel, wherein the power supply assembly is configured to supply power to the display panel; and the display panel includes: a substrate, including a display area and a non-display area surrounding the display area; a light-emitting device and an encapsulation layer which are disposed on the substrate, the light-emitting device being disposed in the display area; and an auxiliary barrier disposed on the substrate, the auxiliary barrier being disposed in the non-display area; wherein a height of the auxiliary barrier is greater than a distance between a side of the encapsulation layer away from the substrate and the substrate.

In a fourth aspect of the embodiments of the present disclosure, a display apparatus is provided. The display apparatus includes: a power supply assembly and a display panel, wherein the power supply assembly is configured to supply power to the display panel; and the display panel is a display panel manufactured by the method for manufacturing the display panel in the second aspect.

DETAILED DESCRIPTION

For clearer descriptions of the objectives, technical solutions, and advantages of the present disclosure, embodiments of the present disclosure are described in detail hereinafter with reference to the accompanying drawings.

In the related art, an OLED display panel may generally include: a light-emitting device and an encapsulation layer. The encapsulation layer may include: a first inorganic encapsulation layer, an organic encapsulation layer and a second inorganic encapsulation layer which are laminated. The encapsulation layer is configured to encapsulate the light-emitting device, to isolate the light-emitting device from outside air, and prevent a light-emitting layer in the light-emitting device from being eroded by components such as moisture and oxygen in air.

In the manufacturing process of the OLED display panel, a display motherboard with multiple OLED display panels is formed at first, then a protective film is attached to the display motherboard, and the display motherboard is cut to acquire the OLED display panel with the protective film. Here, the protective film can protect the OLED display panel and prevent the OLED display panel from being damaged in a detection process. After the OLED display panel is detected, the protective film on the OLED display panel needs to be peeled off.

However, some portions of the second inorganic encapsulation layer and organic encapsulation layer in the OLED display panel may fall off from the OLED display panel in the peeling process of the protective film. As a result, the encapsulation layer has a poor effect of encapsulating the light-emitting device, which affects the product yield of the OLED display panel.

Figure 1:
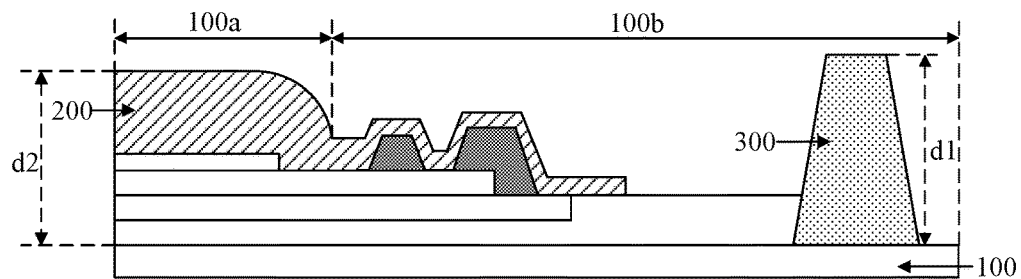
FIG. 1 is a schematic diagram of a film layer structure of a display panel according to an embodiment of the present disclosure.

FIG. 1 is a schematic diagram of a film layer structure of a display panel according to an embodiment of the present disclosure. As shown in FIG. 1, the display panel 000 may include: a substrate 100, a light-emitting device (not shown in the figure), an encapsulation layer 200 and an auxiliary barrier 300.

The substrate 100 in the display panel 000 includes a display area 100a, and a non-display area 100b surrounding the display area 100a.

The light-emitting device and the encapsulation layer 200 in the display panel 000 are both disposed on the substrate 100, and the light-emitting device is disposed in the display area 100a. Here, the encapsulation layer 200 is disposed on a side of the light-emitting device away from the substrate 100, so that the light-emitting device can be encapsulated by the encapsulation layer 200.

The auxiliary barrier 300 in the display panel 000 is also disposed on the substrate 100, and the auxiliary barrier 300 is disposed in the non-display area 100b.

The height d1 of the auxiliary barrier 300 is greater than the distance d2 between the side of the encapsulation layer 200 away from the substrate 100 and the substrate 100.

In the present disclosure, before the display panel 000 is detected, a protective film is formed on the display panel 000, and after the detection is completed, the protective film on the display panel 000 is peeled off. The protective film on the display panel 000 is bonded to the encapsulation layer 200 and the auxiliary barrier 300. The auxiliary barrier 300 is disposed in the non-display area 100b of the display panel 000, and the height of the auxiliary barrier 300 is greater than the distance between the side of the encapsulation layer 200 away from the substrate 100 and the substrate 100. Therefore, in the process of peeling off the protective film on the display panel 000, the protective film is separated from the auxiliary barrier 300 first and then separated from the encapsulation layer 200. In this way, in the peeling process, the acting force between the protective film and the auxiliary barrier 300 is greater than the acting force between the protective film and the encapsulation layer 200, which reduces the probability that the encapsulation layer 200 falls off in the peeling process of the protective film and improves the product yield of the display panel 000.

In summary, the display panel according to the embodiment of the present disclosure includes: the substrate, the light-emitting device, the encapsulation layer, and the auxiliary barrier. Before the display panel is detected, the protective film is formed on the display panel, and after the detection is completed, the protective film on the display panel is peeled off. The auxiliary barrier is disposed in the non-display area of the display panel, and the height of the auxiliary barrier is greater than the distance between the side of the encapsulation layer away from the substrate and the substrate. Therefore, in the process of peeling off the protective film on the display panel, the protective film is separated from the auxiliary barrier first, and then separated from the encapsulation layer. In this way, in the peeling process, the acting force between the protective film and the auxiliary barrier is greater than the acting force between the protective film and the encapsulation layer, which reduces the probability that the encapsulation layer falls off in the peeling process of the protective film, and improves the product yield of the display panel.

In the present disclosure, the structure of the auxiliary barrier 300 has a plurality of possible implementations, and the embodiment of the present disclosure takes the following two possible implementations as examples for schematic illustration.

Figure 2:
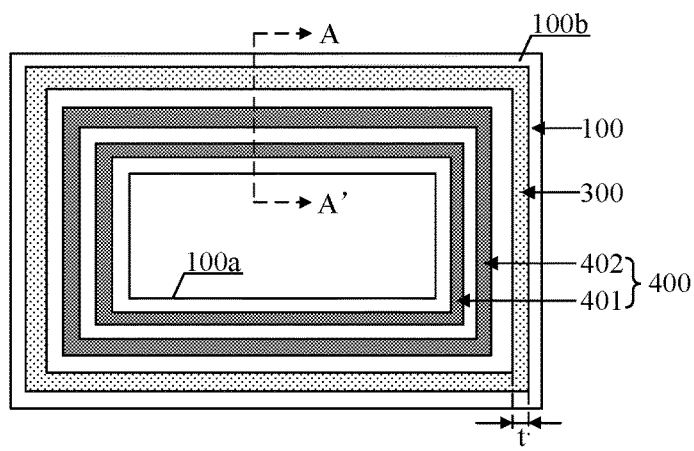
FIG. 2 is a schematic structural diagram of a display panel according to an embodiment of the present disclosure.

In a first possible implementation, as shown in FIG. 2, FIG. 2 is a schematic structural diagram of a display panel according to an embodiment of the present disclosure. The auxiliary barrier 300 in the display panel 000 is annular, and the auxiliary barrier 300 is disposed around the display area 100a. In this way, after the detection of the display panel 000 is completed, when the protective film is peeled off from any direction of the display panel 000, the protective film is first separated from the auxiliary barrier 300, which can further reduce the probability that the encapsulation layer 200 falls off in the peeling process of the protective film and improve the product yield of the display panel 000.

Optionally, a plurality of auxiliary barriers 300 may be disposed, and the plurality of auxiliary barriers 300 are sequentially socketed. In this way, after the detection of the display panel 000 is completed, when the protective film is peeled off from any direction of the display panel 000, the protective film can be first separated from the plurality of auxiliary barriers 300 in sequence, which can further reduce the acting force between the protective film and the encapsulation layer 200, thereby reducing the probability that the encapsulation layer 200 falls off in the peeling process of the protective film, and improving the product yield of the display panel 000.

Figure 3:
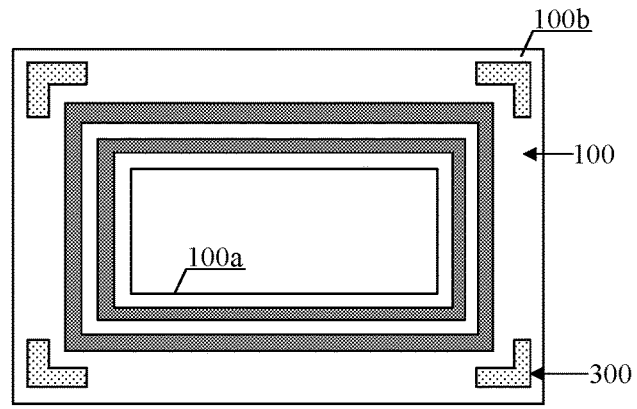
FIG. 3 is a schematic structural diagram of another display panel according to an embodiment of the present disclosure.

In a second possible implementation, as shown in FIG. 3, FIG. 3 is a schematic structural diagram of another display panel according to an embodiment of the present disclosure. The shape of the display area 100a in the display panel 000 is a polygon, the auxiliary barrier 300 is a bent barrier formed by two strip-shaped barriers connected with each other, and the auxiliary barrier 300 is disposed around a top corner of the display area 100a in the display panel 000. For the display panel 000 with a polygonal display area 100a, after the detection of the display panel 000 is completed, when the protective film is peeled off from the display panel 000, the protective film is usually peeled off from the top corner of the display panel 000. Therefore, by disposing the bent auxiliary barrier 300 at the top corner of the display area 100a of the display panel 000, the protective film can be separated from the auxiliary barrier 300 first, which can further reduce the acting force between the protective film and the encapsulation layer 200 duration separation, thereby reducing the probability that the encapsulation layer 200 falls off in the peeling process of the protective film, and improving the product yield of the display panel 000.

Optionally, the shape of the display area 100a in the display panel 000 is a rectangle, four auxiliary barriers 300 may be disposed, and the four auxiliary barriers 300 are respectively disposed around four top corners of the display area 100a. In this way, after the detection of the display panel 000 is completed, when the protective film is peeled off from any top corner of the display panel 000, the protective film can be separated from the auxiliary barrier 300 first, which can further reduce the acting force between the protective film and the encapsulation layer 200, thereby reducing the probability that the encapsulation layer 200 falls off in the peeling process of the protective film, and improving the product yield of the display panel 000.

It should be noted that the following embodiments of the present disclosure take the first possible implementation as an example for schematic illustration. As shown in FIG. 2, the height of the auxiliary barrier 300 in the display panel 000 ranges from 8 to 15 μm. For example, the height of the auxiliary barrier 300 may be 10 μm. The width t of the auxiliary barrier 300 in a direction parallel to the substrate 100 ranges from 30 to 50 μm. For example, the width t of the auxiliary barrier 300 in the direction parallel to the substrate 100 may be 40 μm.

In the present disclosure, the light-emitting device in the display panel 000 may be an OLED light-emitting device, and the light-emitting device may include: a first electrode, a light-emitting layer, and a second electrode which are laminated. The first electrode is a reflective electrode, which may also be generally referred to as an anode. Here, the first electrode may generally be made of a reflective metal material. The second electrode is a light-transmitting electrode, which may also be generally referred to as a cathode. Here, the second electrode may generally be made of a transparent conductive material.

Figure 4:
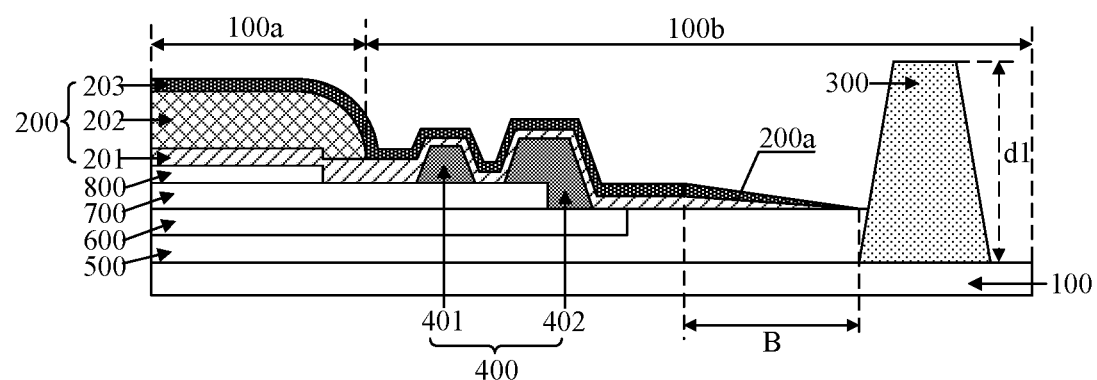
FIG. 4 is a sectional view of the display panel shown in FIG. 2 at A-A'.

In the embodiment of the present disclosure, please refer to FIG. 4, which is a sectional view of the display panel shown in FIG. 2 at A-A'. The encapsulation layer 200 in the display panel 000 may include: a first inorganic encapsulation layer 201, an organic encapsulation layer 202 and a second inorganic encapsulation layer 203 which are laminated. The encapsulation layer 200 is configured to encapsulate the light-emitting device in the display panel 000, to isolate the light-emitting device from outside air, and prevent the light-emitting layer in the light-emitting device from being eroded by components such as moisture and oxygen in air. The first inorganic encapsulation layer 201 and the second inorganic encapsulation layer 203 are configured to isolate the moisture and oxygen in air, the organic encapsulation layer 202 is configured to absorb stress of the first inorganic encapsulation layer 201 and the second inorganic encapsulation layer 203, and the organic encapsulation layer 202 may further be configured to wrap and cover micro-foreign objects on the first inorganic encapsulation layer 201. In the present disclosure, the organic encapsulation layer 202 is formed by means of inkjet printing of a liquid organic material.

In the present disclosure, as shown in FIG. 2 and FIG. 4, the display panel 000 may further include: a barrier body 400 disposed in the non-display area 100b. The barrier body 400 is closer to the display area 100a than the auxiliary barrier 300 is, and the first inorganic encapsulation layer 201 and the second inorganic encapsulation layer 203 may cover the barrier body 400. Here, the barrier body 400 may be configured to block the organic encapsulation layer 202 in the encapsulation layer 200, so that an orthographic projection of the organic encapsulation layer 202 in the encapsulation layer 200 on the substrate 100 is within the display area 100a. That is, the orthographic projection of the organic encapsulation layer 202 on the substrate 100 is not overlapped with an orthographic projection of the barrier body 400 on the substrate 100, which can reduce the probability of encapsulation failure of the encapsulation layer 200 caused by absorption of moisture in the non-display area 100b by the organic encapsulation layer 202.

Exemplarily, as shown in FIG. 2 and FIG. 4, the barrier body 400 in the display panel 000 may be annular, and the barrier body 400 may be disposed around the display area 100a. In this way, the barrier body 400 can block the organic encapsulation layer 202 in the encapsulation layer 200 in all directions.

In the embodiment of the present disclosure, two barrier bodies 400 may be disposed in the display panel 000, and the two barrier bodies 400 may be respectively: a first barrier body 401 and a second barrier body 402. The first barrier body 401 is closer to the display area 100a than the second barrier body 402 is, and the height of the second barrier body 402 is greater than the height of the first barrier body 401. In this way, if the first barrier body 401 fails to completely block the organic encapsulation layer 202 in the encapsulation layer 200, the second barrier body 402 can further block the organic encapsulation layer 202 in the encapsulation layer 200, to improve reliability of the encapsulation layer 200.

Figure 5:
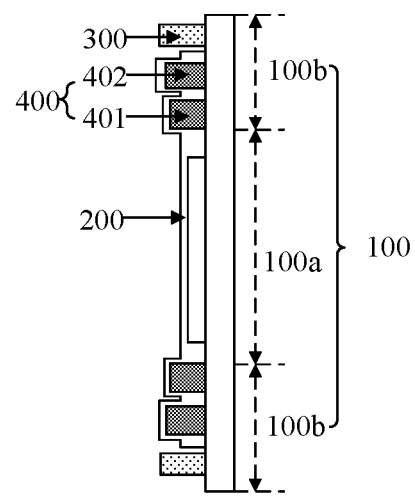
FIG. 5 is a side view of the display panel shown in FIG. 2.

In the present disclosure, as shown in FIG. 5, which is a side view of the display panel shown in FIG. 2, in the display panel 000, the height of the first barrier body 401 and the height of the second barrier body 402 are both less than the height of the auxiliary barrier 300.

In the embodiments of the present disclosure, as shown in FIG. 4, the non-display area 100b in the display panel 000 may include a diffusion area B between the second barrier body 402 and the auxiliary barrier 300, and the encapsulation layer 200 includes an inorganic layer 200a disposed in the diffusion area B. The thickness of the inorganic layer 200a gradually decreases along a direction from the second barrier body 402 to the auxiliary barrier 300.

The first inorganic encapsulation layer 201 and the second inorganic encapsulation layer 203 in the encapsulation layer 200 are usually manufactured by a chemical vapor deposition (CVD) method and the like. When the chemical vapor deposition method is adopted to manufacture the inorganic layer 200a, a mask needs to be used. There is a certain distance between the mask and the substrate in the manufacturing process. Therefore, in the manufacturing process of the first inorganic encapsulation layer 201 and the second inorganic encapsulation layer 203, molecules in the first inorganic encapsulation layer 201 and the second inorganic encapsulation layer 203 enter the gap between the mask and the substrate, thereby forming the inorganic layer 200a in the diffusion area B. This phenomenon is also referred to as a shadow effect. In addition, in the diffusion area B, the thickness of the inorganic layer 200a gradually decreases along a direction going away from the second barrier body 402. The diffusion area B may extend to more than 200 μm.

Optionally, the minimum distance between the auxiliary barrier 300 and the second barrier body 402 ranges from 200 to 500 μm. In this way, it can be ensured that the diffusion area B is located between the second barrier body 402 and the auxiliary barrier 300. If finishing processing needs to be performed on the display panel 000 subsequently, the area including the auxiliary barrier 300 in the display panel 000 needs to be cut, to cut off the auxiliary barrier 300 from the display panel 000. When finishing processing is performed on the display panel 000, the cutting line is located in the diffusion area B, and the inorganic layer 200a disposed in the diffusion area B is relatively thin. Therefore, when the inorganic layer 200a in the diffusion area B is cut, the stress generated in the encapsulation layer 200 is smaller. Thus, the probability of cracks formed in the encapsulation layer 200 due to the larger stress is further reduced, and the product yield of the display panel 000 is further improved.

Optionally, the material of the auxiliary barrier 300 and the material of the barrier body 400 may both include polyimide.

In the present disclosure, the substrate 100 may be a flexible substrate. Exemplarily, the material of the substrate 100 may include polyimide.

In the embodiment of the present disclosure, the display panel may further include: a pixel driving circuit (not shown in the figure) disposed on the substrate 100. The pixel driving circuit may be electrically connected to the light-emitting device. For example, the pixel driving circuit may be electrically connected to the first electrode in the light-emitting device. In this way, the display panel 000 can control the light-emitting device to emit light under driving of the pixel driving circuit.

Exemplarily, as shown in FIG. 4, the display panel 000 may further include: an insulating layer 500, a first metal conductive layer 600, a second metal conductive layer 700 and a pixel defining layer 800 which are sequentially laminated on the substrate 100 in a direction perpendicular to and going away from the substrate 100. The first metal conductive layer 600 and the second metal conductive layer 700 are configured to form conductive structures in the display panel 000, and the conductive structures may include: electrodes, auxiliary cathodes or the like in the pixel driving circuit in the display panel 000.

The pixel defining layer 800 is configured to define a pixel area in the display panel 000, and the light-emitting device in the display panel 000 may be disposed in the pixel area. It should be noted that the encapsulation layer 200 in the display panel 000 is disposed on the side of the pixel defining layer 800 away from the substrate 100, such that it's ensured that the encapsulation layer 200 can normally encapsulate the light-emitting device.

In summary, the display panel according to the embodiment of the present disclosure includes: the substrate, the light-emitting device, the encapsulation layer, and the auxiliary barrier. Before the display panel is detected, the protective film is formed on the display panel, and after the detection is completed, the protective film on the display panel is peeled off. The auxiliary barrier is disposed in the non-display area of the display panel, and the height of the auxiliary barrier is greater than the distance between the side of the encapsulation layer away from the substrate and the substrate. Therefore, in the process of peeling off the protective film on the display panel, the protective film is separated from the auxiliary barrier first, and then separated from the encapsulation layer. In this way, in the peeling process, the acting force between the protective film and the auxiliary barrier is greater than the acting force between the protective film and the encapsulation layer, which reduces the probability that the encapsulation layer falls off in the peeling process of the protective film, and improves the product yield of the display panel.

An embodiment of the present disclosure further provides a method for manufacturing a display panel. The method for manufacturing a display panel may include: forming a light-emitting device, an encapsulation layer and an auxiliary barrier on a substrate.

The substrate includes a display area and a non-display area surrounding the display area. The light-emitting device is disposed in the display area; the auxiliary barrier is disposed in the non-display area; and the height of the auxiliary barrier is greater than the distance between the side of the encapsulation layer away from the substrate and the substrate.

In summary, the method for manufacturing a display panel according to the embodiment of the present disclosure includes: forming the light-emitting device, the encapsulation layer, and the auxiliary barrier on the substrate. Before the display panel is detected, a protective film is formed on the display panel, and after the detection is completed, the protective film on the display panel is peeled off. The auxiliary barrier is disposed in the non-display area of the display panel, and the height of the auxiliary barrier is greater than the distance between the side of the encapsulation layer away from the substrate and the substrate. Therefore, in the process of peeling off the protective film on the display panel, the protective film is separated from the auxiliary barrier first, and then separated from the encapsulation layer. In this way, in the peeling process, the acting force between the protective film and the auxiliary barrier is greater than the acting force between the protective film and the encapsulation layer, which reduces the probability that the encapsulation layer falls off in the peeling process of the protective film, and improves the product yield of the display panel.

Figure 6:
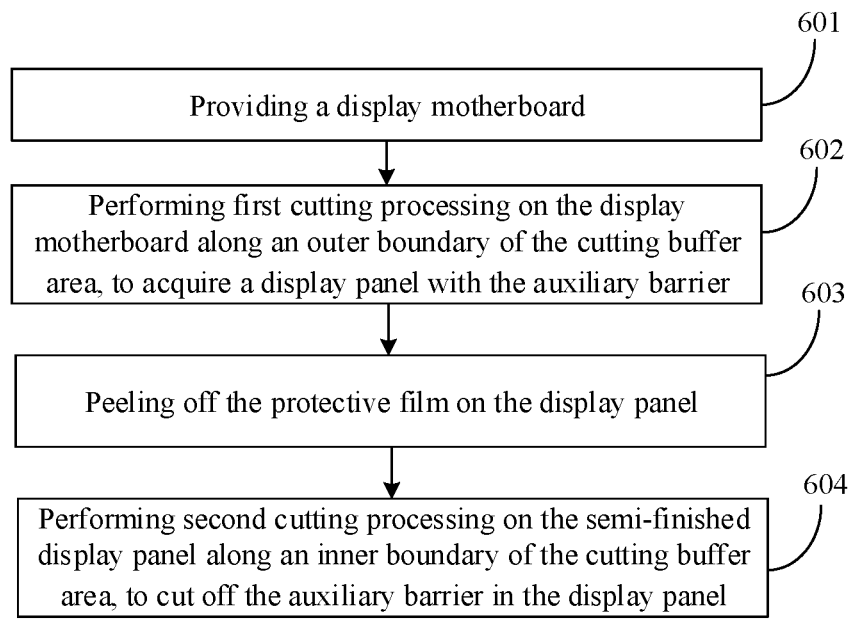
FIG. 6 is a flowchart of a method for manufacturing a display panel according to an embodiment of the present disclosure.

Please refer to FIG. 6. FIG. 6 is a flowchart of a method for manufacturing a display panel according to an embodiment of the present disclosure. The method for manufacturing a display panel may include the following steps.

In step 601, a display motherboard is provided.

Figure 7:
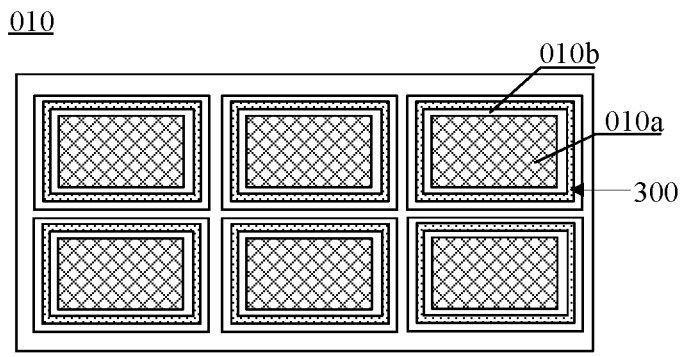
FIG. 7 is a schematic structural diagram of a display motherboard according to an embodiment of the present disclosure.

Please refer to FIG. 7, and FIG. 7 is a schematic structural diagram of a display motherboard according to an embodiment of the present disclosure. The display motherboard 010 may have a plurality of panel areas 010*a*, and an annular cutting buffer area 010*b* surrounding each panel area 010*a*. The display motherboard 010 may include: the light-emitting device and the encapsulation layer which are disposed in the panel area 010*a*, and the auxiliary barrier 300 disposed in the cutting buffer area 010*b*. For example, for the structure, in the panel area 010*a*, of the display motherboard 010, reference may be made to the part, other than the auxiliary barrier 300, of the display panel 000 shown in FIG. 1 or FIG. 4; and for the structure, in the cutting buffer area 010*b*, of the auxiliary barrier 300, reference may be made to the auxiliary barrier in the display panel 000 shown in FIG. 1, FIG. 2, FIG. 3 or FIG. 4. It should be noted that the cutting buffer area 010*b* may include: the area where the auxiliary barrier 300 is disposed and the diffusion area shown in FIG. 4.

In step 602, first cutting processing is performed on the display motherboard along an outer boundary of the cutting buffer area, to acquire a display panel with the auxiliary barrier.

In the embodiment of the present disclosure, the first cutting processing may be performed on the display motherboard by using a laser cutting technology along the outer boundary of the cutting buffer area, to acquire the display panel with the auxiliary barrier. Exemplarily, for the structure of the display panel with the auxiliary barrier, reference may be made to FIG. 1 or FIG. 4.

Optionally, the display motherboard may further include: a protective film bonded to the encapsulation layer and the auxiliary barrier. Therefore, after the first cutting processing is performed on the display motherboard, the acquired display panel includes not only the auxiliary barrier but also the protective film. After step 602, the acquired display panel needs to be detected. Here, the protective film can protect the display panel and prevent the display panel from being damaged in the detection process.

The auxiliary barrier and the protective film do not play a role in the working process of the display panel. Therefore, in order to reduce the thickness of the display panel, finishing processing needs to be performed on the display panel to remove the auxiliary barrier and the protective film in the display panel. Therefore, in the method for manufacturing a display panel in the embodiment of the present disclosure, the following steps 603 and 604 also need to be executed.

In step 603, the protective film on the display panel is peeled off.

In the embodiment of the present disclosure, the height of the auxiliary barrier is greater than the distance between the side of the encapsulation layer away from the substrate and the substrate. Therefore, in the process of peeling off the protective film on the display panel, the protective film is first separated from the auxiliary barrier, and then separated from the encapsulation layer. In this way, in the peeling process, the acting force between the protective film and the auxiliary barrier is greater than the acting force between the protective film and the encapsulation layer, which reduces the probability that the encapsulation layer falls off in the peeling process of the protective film, and improves the product yield of the display panel.

In step 604, second cutting processing is performed on the semi-finished display panel along an inner boundary of the cutting buffer area, to cut off the auxiliary barrier in the display panel.

Exemplarily, when the display panel is the display panel shown in FIG. 4, the inner boundary of the cutting buffer area is in the diffusion area B of the display panel. The inorganic layer 200*a* disposed in the diffusion area B is relatively thin. Therefore, when the inorganic layer 200*a* in the diffusion area B is cut, the stress generated in the encapsulation layer 200 is smaller, thereby reducing the probability of cracks formed in the encapsulation layer 200 due to the larger stress, and improving the product yield of the semi-finished display panel.

It should be noted that the display panel acquired after step 604 does not include the auxiliary barrier.

Optionally, before step 601, the method for manufacturing a display panel further includes the following steps.

In step S1, a rigid substrate is provided.

Exemplarily, the material of the rigid substrate may include a glass material.

In step S2, a flexible substrate is formed on the rigid substrate.

Exemplarily, the material of the flexible substrate may include polyimide, and the flexible substrate has a plurality of panel areas, and an annular cutting buffer area around each of the panel areas.

In step S3, the light-emitting device and the encapsulation layer are formed in each panel area of the flexible substrate, and the auxiliary barrier is formed in each cutting buffer area.

In step S4, the rigid substrate is peeled off.

Exemplarily, the rigid substrate may be peeled off by means of laser lift-off.

In step S5, a protective film bonded to the encapsulation layer and the auxiliary barrier, and a substrate protective film bonded to the side of the flexible substrate away from the light-emitting device are formed, to acquire a display motherboard.

The substrate protective film is configured to protect the flexible substrate, to avoid the flexible substrate from be damaged in the subsequent detection process of the display panel. It should be noted that, in the process of executing step 603, not only the protective film on the display panel needs to be peeled off, but also the substrate protective film needs to be peeled off.

In summary, the method for manufacturing a display panel according to the embodiment of the present disclosure includes: forming the light-emitting device, the encapsulation layer, and the auxiliary barrier on the substrate. Before the display panel is detected, the protective film is formed on the display panel, and after the detection is completed, the protective film on the display panel is peeled off. The auxiliary barrier is disposed in the non-display area of the display panel, and the height of the auxiliary barrier is greater than the distance between the side of the encapsulation layer away from the substrate and the substrate. Therefore, in the process of peeling off the protective film on the display panel, the protective film is separated from the auxiliary barrier first, and then separated from the encapsulation layer. In this way, in the peeling process, the acting force between the protective film and the auxiliary barrier is greater than the acting force between the protective film and the encapsulation layer, which reduces the probability that the encapsulation layer falls off in the peeling process of the protective film, and improves the product yield of the display panel.

An embodiment of the present disclosure further provides a display apparatus, and the display apparatus may include: a power supply assembly and a display panel. The power supply assembly is configured to supply power to the display panel. The display panel may be the display panel shown in FIG. 1 or FIG. 4, or the display panel manufactured by the method for manufacturing a display panel shown in FIG. 6. The display apparatus may be any product or component with a display function, such as a liquid crystal panel, electronic paper, a mobile phone, a tablet computer, a television, a display, a notebook computer, a digital photo frame and a navigator.

It should be noted that in the accompanying drawings, for clarity of the illustration, the dimension of the layers and regions may be scaled up. It may be understood that when an element or layer is described as being "on" another element or layer, the described element or layer may be directly on the other element or layer, or an intermediate layer may exist. In addition, it may be understood that when an element or layer is described as being "under" another element or layer, the described element or layer may be directly under the other element or layer, or more than one intermediate layer or element may exist. In addition, it may be further understood that when a layer or element is described as being arranged "between" two layers or elements, the described layer or element may be the only layer between the two layers or elements, or more than one intermediate layer or element may exist. In the whole description, similar reference signs denote similar elements.

In the present disclosure, the terms "first" and "second" are intended for descriptive purposes only and are not to be construed as indicating or implying relative importance. The term "a plurality" refers to two or more, unless specifically defined otherwise.

The foregoing descriptions are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:
    a substrate, comprising a display area and a non-display area surrounding the display area;
    a light-emitting device and an encapsulation layer which are disposed on the substrate, the light-emitting device being disposed in the display area; and
    an auxiliary barrier disposed on the substrate, the auxiliary barrier being disposed in the non-display area;
    wherein a height of the auxiliary barrier is greater than a distance between a side of the encapsulation layer away from the substrate and the substrate,
    wherein the encapsulation layer comprises: a first inorganic encapsulation layer, an organic encapsulation layer and a second inorganic encapsulation layer which are laminated,
    the display panel further comprising:
    a barrier body disposed in the non-display area, wherein the barrier body is closer to the display area than the auxiliary barrier is, the first inorganic encapsulation layer and the second inorganic encapsulation layer cover the barrier body, and an orthographic projection of the organic encapsulation layer on the substrate and an orthographic projection of the barrier body on the substrate are not overlapped, wherein the barrier body is annular, and the barrier body is disposed around the display area, wherein two barrier bodies are provided, and the two barrier bodies are a first barrier body and a second barrier body respectively, wherein the first barrier body is closer to the display area than the second barrier body is, and a height of the second barrier body is greater than a height of the first barrier body, wherein the non-display area comprises: a diffusion area disposed between the second barrier body and the auxiliary barrier, and the encapsulation layer comprises an inorganic layer disposed in the diffusion area, wherein a thickness of the inorganic layer gradually decreases along a direction from the second barrier body to the auxiliary barrier.

2. The display panel according to claim 1, wherein the auxiliary barrier is annular, and the auxiliary barrier is disposed around the display area.

3. The display panel according to claim 2, wherein a plurality of auxiliary barriers are provided, and the plurality of auxiliary barriers are sequentially socketed.

4. The display panel according to claim 1, wherein a shape of the display area is a polygon, the auxiliary barrier is a bent barrier formed by two strip-shaped barriers connected with each other, and the auxiliary barrier is disposed around a top corner of the display area.

5. The display panel according to claim 4, wherein the shape of the display area is a rectangle, and four auxiliary barriers are provided, wherein the four auxiliary barriers are disposed around four top corners of the display area respectively.

6. The display panel according to claim 1, wherein the height of the auxiliary barrier ranges from 8 to 15 µm, and a width of the auxiliary barrier in a direction parallel to the substrate ranges from 30 to 50 µm.

7. The display panel according to claim 1, wherein the height of the first barrier body and the height of the second barrier body are both less than the height of the auxiliary barrier.

8. The display panel according to claim 1, wherein a minimum distance between the auxiliary barrier and the second barrier body ranges from 200 to 500 µm.

9. The display panel according to claim 1, wherein a material of the auxiliary barrier and a material of the barrier body both comprise: polyimide.

10. The display panel according to claim 9, further comprising: a pixel defining layer disposed on the substrate, wherein the pixel defining layer is configured to define a pixel area in the display panel, the light-emitting device is disposed in the pixel area, and the encapsulation layer is disposed on a side of the pixel defining layer away from the substrate.

11. A display apparatus, comprising: a power supply assembly and a display panel, wherein the power supply assembly is configured to supply power to the display panel; and the display panel comprises:
- a substrate, comprising a display area and a non-display area surrounding the display area;
- a light-emitting device and an encapsulation layer which are disposed on the substrate, the light-emitting device being disposed in the display area; and
- an auxiliary barrier disposed on the substrate, the auxiliary barrier being disposed in the non-display area;
- wherein a height of the auxiliary barrier is greater than a distance between a side of the encapsulation layer away from the substrate and the substrate,
- wherein the encapsulation layer comprises: a first inorganic encapsulation layer, an organic encapsulation layer and a second inorganic encapsulation layer which are laminated, the display panel further comprising: a barrier body disposed in the non-display area, wherein the barrier body is closer to the display area than the auxiliary barrier is, the first inorganic encapsulation layer and the second inorganic encapsulation layer cover the barrier body, and an orthographic projection of the organic encapsulation layer on the substrate and an orthographic projection of the barrier body on the substrate are not overlapped, wherein the barrier body is annular, and the barrier body is disposed around the display area, wherein two barrier bodies are provided, and the two barrier bodies are a first barrier body and a second barrier body respectively, wherein the first barrier body is closer to the display area than the second barrier body is, and a height of the second barrier body is greater than a height of the first barrier body.

\* \* \* \* \*